United States Patent
Redding et al.

(10) Patent No.: US 7,804,230 B2
(45) Date of Patent: Sep. 28, 2010

(54) PIEZOELECTRIC ACTUATOR

(75) Inventors: Keith Redding, Gillingham (GB);
Martin Hardy, Gillingham (GB);
Stavros Sfakianakis, Salonika (GR)

(73) Assignee: Delphi Technologies Holding S.arl, Troy, MI (US)

( * ) Notice: Subject to any disclaimer, the term of this patent is extended or adjusted under 35 U.S.C. 154(b) by 0 days.

(21) Appl. No.: 11/343,339

(22) Filed: Jan. 31, 2006

(65) Prior Publication Data
US 2006/0186767 A1 Aug. 24, 2006

(30) Foreign Application Priority Data
Feb. 3, 2005 (EP) .................................. 05250603

(51) Int. Cl.
*H01L 41/047* (2006.01)
(52) U.S. Cl. ...................................... 310/348; 310/366
(58) Field of Classification Search ................. 310/348, 310/365, 366
See application file for complete search history.

(56) References Cited

U.S. PATENT DOCUMENTS

| | | | | |
|---|---|---|---|---|
| 6,234,404 | B1 * | 5/2001 | Cooke | 239/88 |
| 6,563,687 | B2 * | 5/2003 | Kawazoe et al. | 361/301.4 |
| 6,575,138 | B2 * | 6/2003 | Welch et al. | 123/467 |
| 2001/0032893 | A1 * | 10/2001 | Lambert | 239/533.3 |
| 2002/0005680 | A1 * | 1/2002 | Kobayashi et al. | 310/328 |
| 2005/0006495 | A1 * | 1/2005 | Schurz et al. | 239/102.2 |

FOREIGN PATENT DOCUMENTS

| | | |
|---|---|---|
| EP | 0 995 901 | 4/2000 |
| EP | 1096136 | 5/2001 |

* cited by examiner

*Primary Examiner*—Walter Benson
*Assistant Examiner*—Derek J Rosenau
(74) *Attorney, Agent, or Firm*—Thomas N. Twomey

(57) ABSTRACT

A piezoelectric actuator for use in a fuel injector, the actuator comprising a stack of one or more piezoelectric elements for receipt within an accumulator chamber of the injector, distribution electrode means for generating an electric field within the stack and an electrical connector arrangement including a body member defining an external boundary and including a base portion and a stem portion projecting from the base portion. The base portion defines a base end face for abutment with an adjacent end face associated with the stack. Terminal means are provided for connection with an external power supply. The terminal means includes first and second terminal members disposed internal to the external boundary of the body member. The first and second terminal members are arranged side by side and disposed internal to the external boundary of the body member. The actuator further comprises first and second contact plates, each of which is connected electrically to a first end of a respective one of the first and second terminal members. The first and second terminal members are further connectable with an external power supply, in use, so as enable voltage supply to the distribution electrode means. The base portion of the body member defines a sealing surface for abutment with an internal surface defined by the accumulator chamber.

7 Claims, 11 Drawing Sheets

PIEZOELECTRIC ACTUATOR

The present invention relates to a piezoelectric actuator and, particularly, to an electrical connector arrangement for a piezoelectric actuator of the type suitable for use in a fuel injector in an internal combustion engine.

Automotive fuel injectors for delivering predetermined quantities of fuel into a combustion space of an internal combustion engine typically comprise a control piston which is operable to control the pressure of fuel contained within an injector control chamber. The control chamber is defined, in part, by a surface associated with an injector valve needle such that changes of fuel pressure within the control chamber cause movement of the valve needle into and out of engagement with an associated seating surface. As a result, delivery of pressurised fuel into the combustion space of the engine is controlled.

It is known to provide a fuel injector with a piezoelectric actuator to control movement of the control piston. Piezoelectric actuators used for this purpose are generally in the form of a stack body having a multi-layered laminated stack of piezo-ceramic elements or layers, each of which is separated by an electrically conductive layer. The electrically conductive layers act as internal electrode layers. The stack body is provided with positive and negative distribution electrodes arranged to establish electrical contact with the internal electrode layers. The distribution electrodes are connectable to a power supply and convey a voltage to the internal electrode layers.

Application of a voltage across the internal electrodes causes expansion and contraction of the stack corresponding to the magnitude and the polarity of the applied voltage. The change in length of the stack is used to control movement of the control piston and thus opening and closing of the valve needle.

It is known that the application of a compressive force to a piezoelectric stack influences beneficially its performance and durability. In the case of piezoelectrically operable fuel injectors for use in compression-ignition internal combustion engines, a known approach is to locate the piezoelectric stack within a fuel-filled accumulator volume or chamber. Typically, fuel within the accumulator volume is maintained at pressures of up to 2000 bar and so the piezoelectric stack experiences a high compressive loading due to hydrostatic forces. An actuator of this type is exemplified in EP0995901. Enveloping the stack within a polymer casing or sleeve guards against ingress of high pressure fuel into the stack structure.

Although locating the piezoelectric actuator in a high pressure fluid environment has its associated advantages, it is necessary to ensure that the electrical connections to the stack are adequately and reliably sealed from high pressure fuel within the accumulator volume. It is also vital that the high hydrostatic forces or the aggressive chemical effects of the fuel-laden environment do not adversely affect the provisions for sealing or insulating the stack.

It is an object of the present invention to provide an electrical connector arrangement that addresses these concerns.

In accordance with a first aspect of the present invention, there is provided a piezoelectric actuator for use in a fuel injector, the actuator comprising a stack of one or more piezoelectric elements for receipt within an accumulator chamber of the injector and distribution electrode means for generating an electric field within the stack and an electrical connector arrangement. The electrical connector arrangement includes a body member defining an external boundary and including a base portion and a stem portion projecting from the base portion, wherein the base portion defines a base end face for abutment with an adjacent end face associated with the stack. Terminal means is provided for connection with an external power supply, the terminal means including first and second terminal members disposed internal to the external boundary of the body member. The terminal means further include first and second contact plates, each of which is connected electrically to one end of a respective one of the first and second terminal members. The base portion of the body member further defines a sealing surface for abutment with a mating surface defined by the accumulator chamber, in use.

The distribution electrode means preferably includes first and second distribution electrodes arranged one on either side of the stack. In a preferred embodiment, each of the first and second contact plates includes a radially outer face which connects with an inner face of the first and second distribution electrodes. Furthermore, each of the first and second terminal members has another end in electrical connection with a respective one of first and second terminal blades of the terminal means.

Due to the problems created by locating the actuator within a high temperature and high pressure environment, in use, it is preferable that second ends of the terminal members are attached to an upper end face of the stem portion and each of the first ends of the terminal members is attached to a base end face of the base portion. Since the ends of the terminal members are attached to the body member only at respective end faces thereof, differential expansion and contraction between the body member and terminal members may be accommodated more readily so as to limit mechanical stresses and strains within the terminal members. Moreover, it is preferred that the terminal members and the body member are selected such that their coefficients of expansion are substantially the same in order to limit the extent of the stresses and strains still further.

A particular advantage of the invention is that the base portion serves to support, insulate and protect the terminal members from the aggressive environment in which the actuator is used, whilst also providing a sealing surface engaging a mating surface defined by the accumulator chamber. In existing designs, the aforesaid functions often have been performed by distinct components. Preferably, a shoulder region of the base portion defines the sealing surface. Moreover, it is preferred that the body member is a unitary body of ceramic material.

In one embodiment, the overall length of the connector arrangement may be extended by the provision of an extension piece to accommodate at least one terminal member of greater length. Through the addition of one or more extension pieces to the body member, the flexibility of the connector arrangement to suit a particular application is improved.

In accordance with a second aspect of the invention, there is provided a piezoelectric actuator for use in a fuel injector, the actuator comprising a stack of one or more piezoelectric elements for receipt within an accumulator chamber of the injector, first and second distribution electrodes, arranged one on either side of the stack, for generating an electric field within the stack, and an electrical connector arrangement including a body member having a base portion and a stem portion projecting from the base portion, wherein the base portion defines a base end face for abutment with an adjacent end face associated with the stack. First and second terminal members are disposed, at least in part, inside the body member, and first and second contact plates are provided, each of which is connected electrically to a first end of a respective one of the first and second terminal members and to a respective one of the first and second distribution electrodes. Each of the first and second contact plates includes a radially outer surface, which makes contact with an inner surface of the respective one of the first and second distribution electrodes. The first and second terminal members are connectable with an external power supply, in use, so as enable voltage supply to the first and second distribution electrodes. The base portion further defines a sealing surface for abutment with an internal surface defined by the accumulator chamber.

In a third aspect of the invention, a piezoelectric actuator for use in a fuel injector comprises a stack of one or more piezoelectric elements for receipt within an accumulator chamber of the injector, a distribution electrode arrangement for generating an electric field within the stack, and an electrical connector arrangement. The electrical connector arrangement includes a body member defining an external boundary and including a base portion and a stem portion projecting from the base portion, wherein the base portion defines a base end face for abutment with an adjacent end face associated with the stack, and wherein the base portion further defines a sealing surface for abutment with an internal surface defined by the accumulator chamber. A terminal arrangement is connectable, in use, with an external power supply so as enable voltage supply to the distribution electrode arrangement, the terminal arrangement including at least one terminal member disposed internal to the external boundary of the body member and at least one contact plate, the or each of which is connected to a first end of a respective one of the at least one terminal members.

In a fourth aspect of the invention, a fuel injector comprises an injector body having a nozzle body, secured at one end, the nozzle body defining a bore in which an injector valve needle is slidable to control fuel injection from outlet openings provided in the nozzle body wherein the injector body defines an accumulator chamber within which a piezoelectric actuator, as described above, is received.

It should be noted that the preferred and optional features as defined above are applicable to all aspects of the invention.

So that it may be more readily understood, the present invention will now be described, by way of example only, with reference to the accompanying drawings in which.

Figure 1:
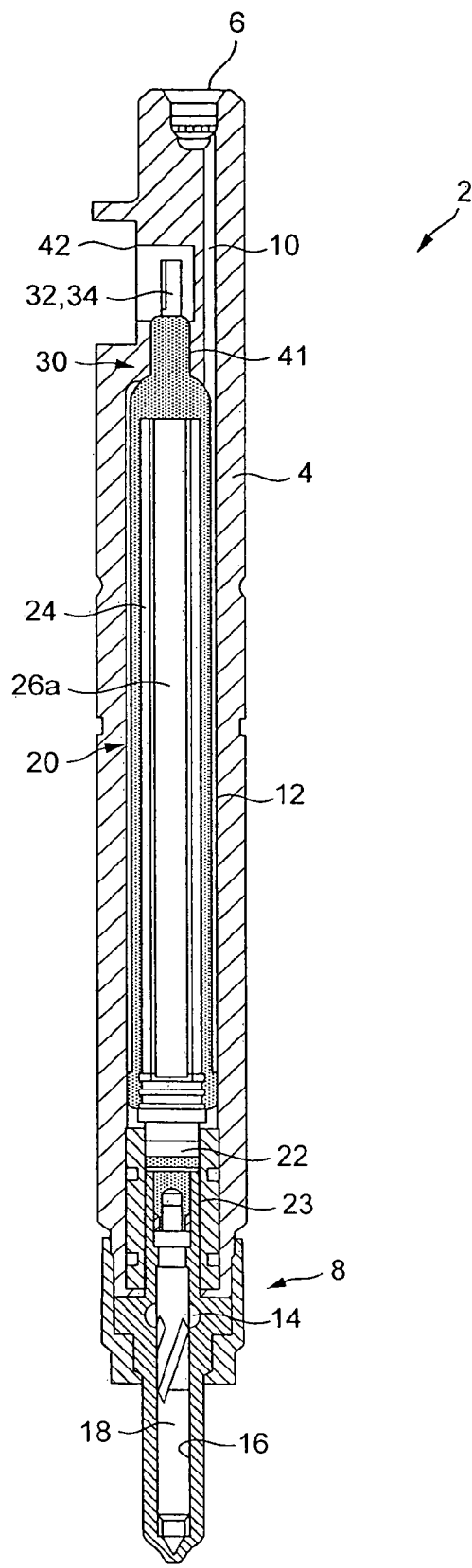
FIG. 1 is a sectional view of a fuel injector having a piezoelectric actuator of the present invention.

FIG. 1 shows a piezoelectric fuel injector 2 suitable for use within an internal combustion engine. The fuel injector 2 includes an injector body 4 having a first (upper) end defining an inlet 6 for connection to a source of pressurised fuel and a second (lower) end to which an injection nozzle body 8 is connected. The nozzle body 8 is provided with an axial bore 16 within which a valve needle 18 is slidable. It will be appreciated that the terms upper and lower are referred to in the context of the drawings and are not intended to limit any of the components thereby described to a specific orientation. Between its ends, the injector body 4 defines fuel passageways in the form of an inlet passage 10 and an accumulator volume or chamber 12.

Fuel is supplied to the injector body 2 via the inlet 6 from a common rail or other appropriate source of pressurised fuel, which may also be arranged to supply fuel to one or more other injectors (not shown) of the engine. Pressurised fuel is conveyed from the inlet 6, through the inlet passage 10 and the accumulator volume 12, to an annular chamber 14 which forms part of the axial bore 16 defined by the nozzle body 8.

The accumulator volume 12 houses a piezoelectric stack-type actuator (referred to generally as 20). Linear expansion and contraction of the actuator 20 is transmitted to the valve needle 18 via a control piston 22 which is attached, or coupled, to a first (lowermost) end of the actuator 20 and serves to control the volume, and therefore the pressure, of fuel within a control chamber 23. By controlling the pressure of fuel within the control chamber 23, the position of the control piston 22 controls whether or not fuel injection occurs through one or more nozzle outlets (not shown).

The actuator 20 comprises a stack 24 of piezoelectric elements, each of which is separated by an internal electrode layer in a manner known in the art (the individual piezoelectric elements and the internal electrodes are not visible in FIG. 1). The stack 24 is provided with a distribution electrode means in the form of positive and negative distribution electrodes 26a, 26b (only one of which is shown in FIG. 1) that run longitudinally along opposing side faces of the stack 24 and make electrical contact with the internal electrodes of the stack 24.

An electrical connector arrangement or module 30 is located at the ceiling, or upper end, of the accumulator volume 12 and extends through a longitudinal drilling or channel 41 provided in the injector body 4. Although FIG. 1 does not show the connector module 30 in detail, it can be seen that the module includes a terminal means having a pair of positive and negative terminal blades 32, 34 which project away from the connector module 30 to reside in a lateral recess 42 provided in the injector body 4. The terminal blades 32, 34 provide a convenient fixture point for an external power supply plug and serve to convey an applied voltage to the distribution electrodes 26a, 26b, and thus to the internal stack electrodes, via the connector module 30. By controlling the applied voltage, the length of the stack 24 can be increased or decreased thereby to control the axial position of the control piston 22 and, thus, the pressure within the control chamber 23.

Figure 2:
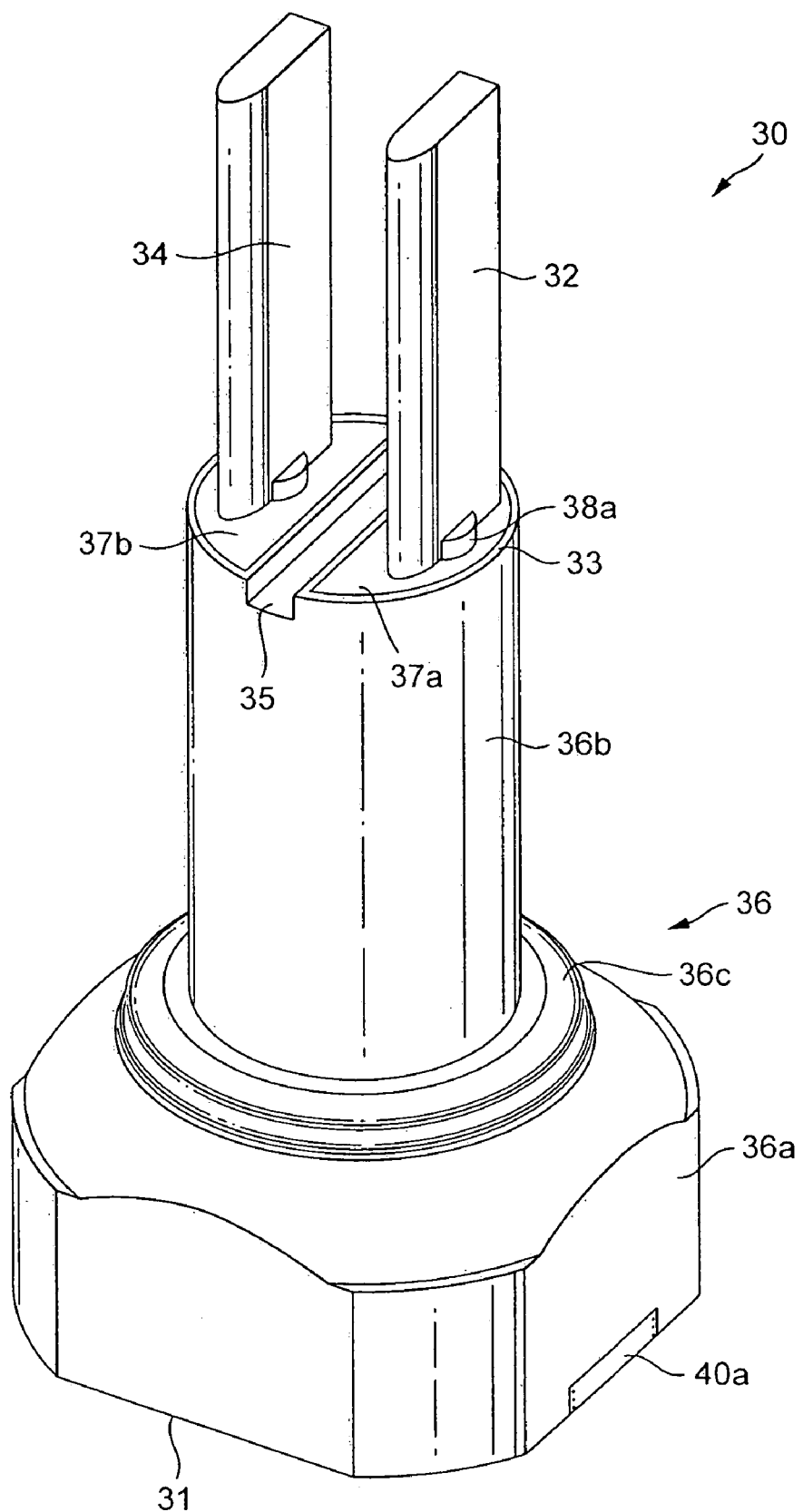
FIG. 2 is an enlarged perspective view, from above, of a connector arrangement for the actuator in FIG. 1.
Figure 3:
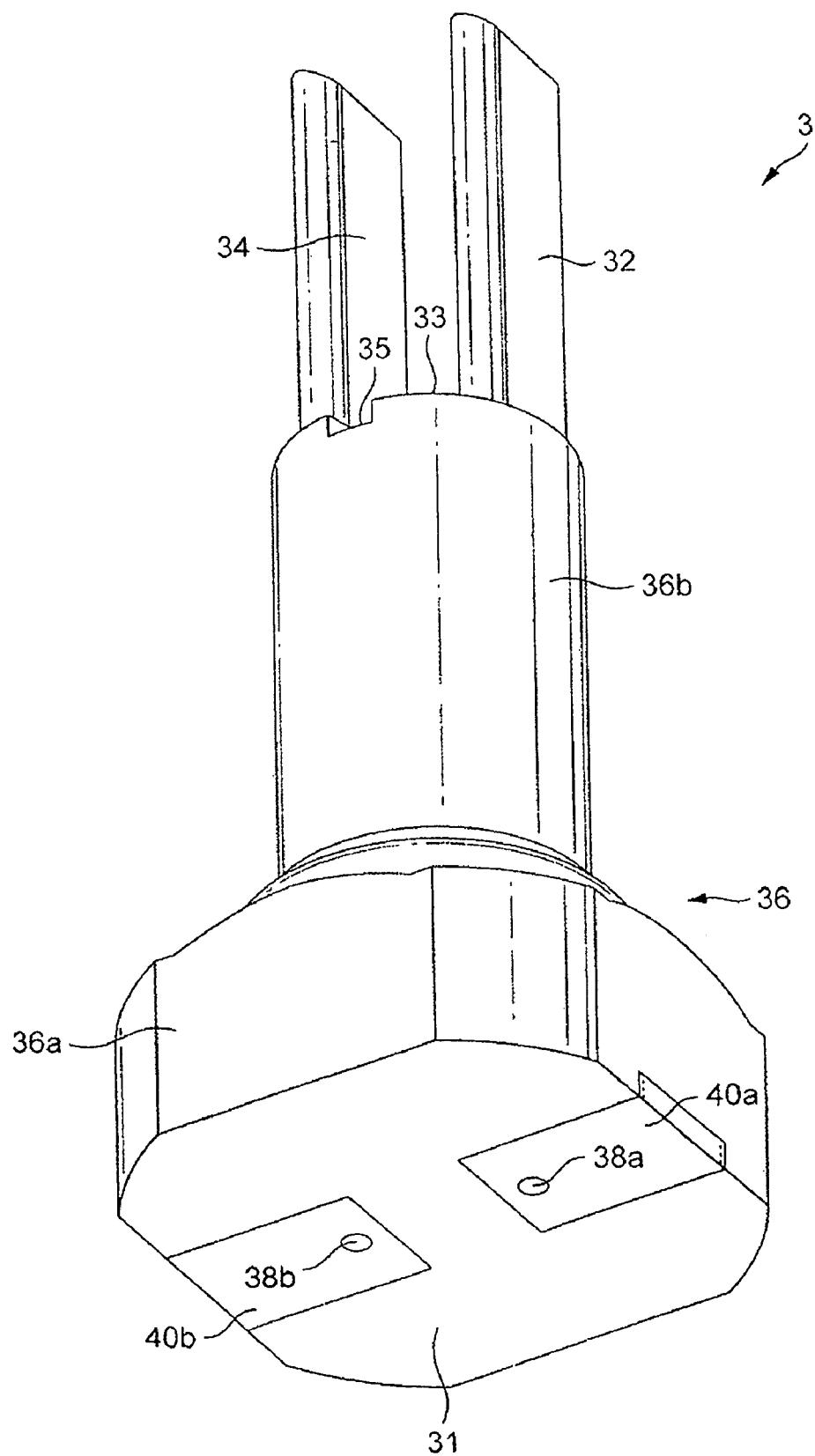
FIG. 3 is an enlarged perspective view, from below, of the connector arrangement in FIG. 2.
Figure 4:
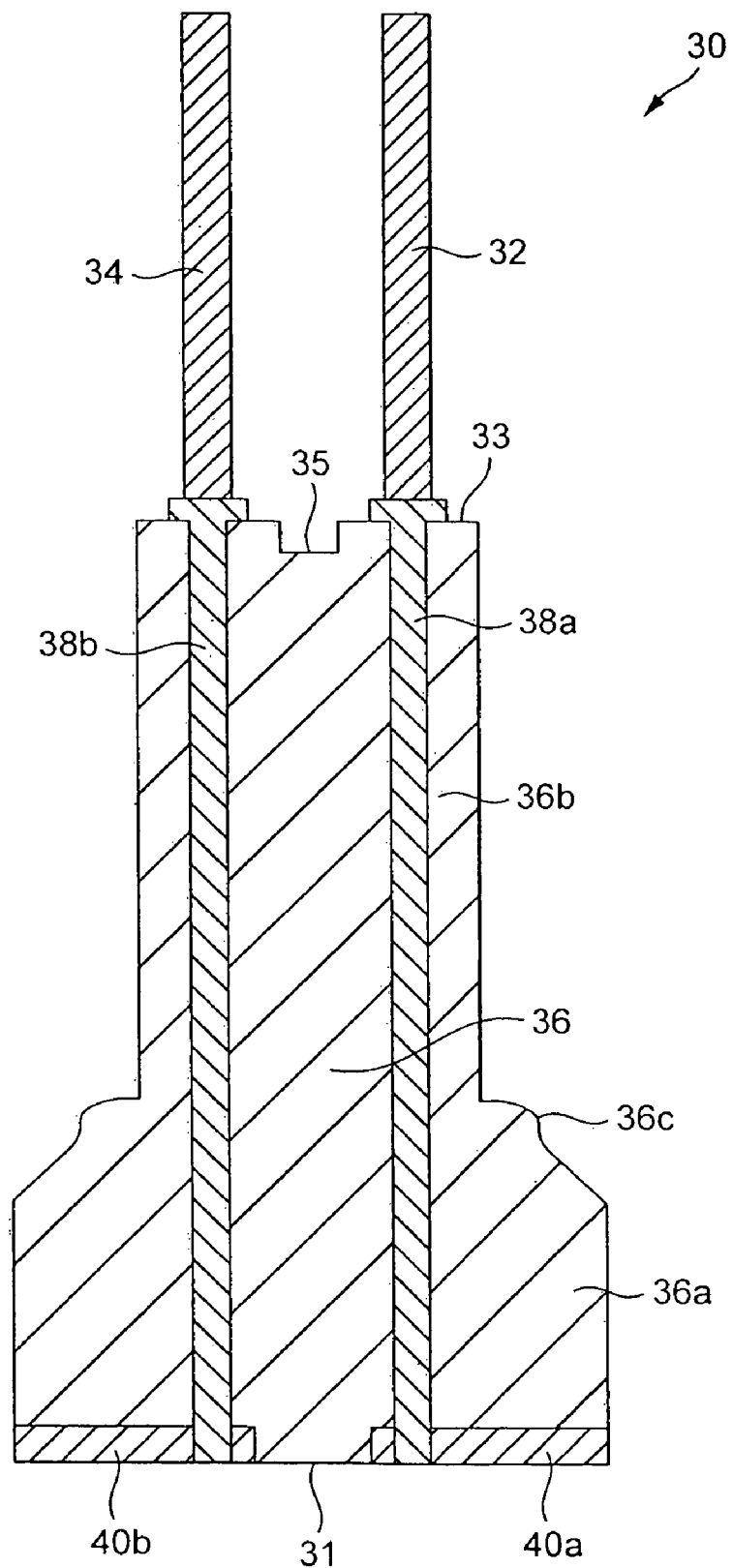
FIG. 4 is a sectional view of the connector arrangement in FIGS. 2 to 3.

The connector module 30 of FIG. 1 will now be described in greater detail. Referring to FIGS. 2 to 4, the connector module 30 includes a module body member 36 comprising a base portion 36a in the form of a block which tapers into a generally cylindrical stem portion 36b and so defines an annular shoulder region 36c therebetween. The annular shoulder region 36c serves as a sealing surface which engages the opening 41 to prevent the escape of pressurised fuel from the accumulator volume 12, as will be described in greater detail later. The connector module 30 is preferably formed from a ceramic material such as high grade alumina in order to withstand the aggressive environment within which it is located. However, the connector module may be formed from a less resilient material if conditions permit.

The base portion 36a of the body member 36 defines a substantially flat, base end face 31 of the module 30 and the stem portion 36b defines an upper end face 33 of the module 30. The terminal means of the module 30 includes first and second terminal members, which take the form of positive and negative terminal pins 38a, 38b which are arranged next to one another, side by side, and extend longitudinally through the module 30 to terminate in the terminal blades 32, 34 projecting from the upper end face 33. The terminal pins 38a, 38b are arranged such that first ends of the terminal pins 38a, 38b terminate at the upper end face 33 of the module 30 and second ends of the terminal pins 38a, 38b terminate at the base end face 31 of the module 30. The ends of the terminal pins 38a, 38b are fixed to their respective end faces 31, 33 by metallised regions, of which only the metallised regions 37a, 37b on the upper end face 33 of the module 30 are shown in the Figures. The metallised regions 37a, 37b are separated by a cross-channel 35 that serves to guard against electrical arcing between the terminal blades 32, 34. The metallised regions 37a, 37b may be formed by such techniques as ink printing, vapour deposition or brazing, for example. Similarly, the positive and negative terminal blades 32, 34 extend upwardly from the upper face of the stem portion 36b and are affixed to their corresponding metallised regions 37a, 37b by brazing or an equivalent technique such that a high strength contact is achieved.

Since the terminal pins 38a, 38b are fixed to the body member 36 at, or in the region of, its upper and lower end faces 31, 33, most of the outer surface of each terminal pin 38a, 38b is not in fixed contact with the connector module 30. As a result, the differential expansion between the body member 36 and the terminal pins 38a, 38b, as may occur through heating of the components during use, may more readily be absorbed. Indeed, it is a feature of the invention that the material from which the terminal pins 38a, 38b are formed is selected such that its coefficient of expansion is substantially the same as that of the ceramic material of the connector module 30. As a result, tensile or compressive forces exerted on the terminal pins 38a, 38b are limited. In this embodiment, the terminal pins 38a, 38b are formed from a low expansion alloy such as KOVAR® although it should be appreciated that other materials that exhibit the appropriate chemical and electrical properties may also be used to form the terminal pins 38a, 38b.

With specific reference to FIGS. 3 and 4, the base end face 31 of the base portion 36 of the module 30 is shaped to define first and second recesses, of rectilinear form, which receive correspondingly shaped metallic contact plates 40a, 40b. Each contact plate 40a, 40b defines a hole through which a respective terminal pin 38a, 38b may extend, thereby electrically connecting the contact plates 40a, 40b to the terminal blades 32, 34 via the terminal pins 38a, 38b. It will be appreciated, therefore, that the terminal blades 32, 34, terminal pins 38a, 38b and contact plates 40a, 40b together form the terminal means of the connector module 30 and provide positive and negative conductor paths from an external power supply to a respective distribution electrode 26a, 26b of the stack 24. The contact plates 40a, 40b are arranged such that a radially outer face thereof lies flush with a radially outer face of the base portion 36a of the body member 36. In this embodiment, the contact plates 40a, 40b are formed from an alloy comprising iron, nickel and copper, although it should be appreciated that other suitable materials may also be used. Proprietary materials are available for this purpose, for example INVAR®, COVAR® and INCOLOY®.

Figure 5:
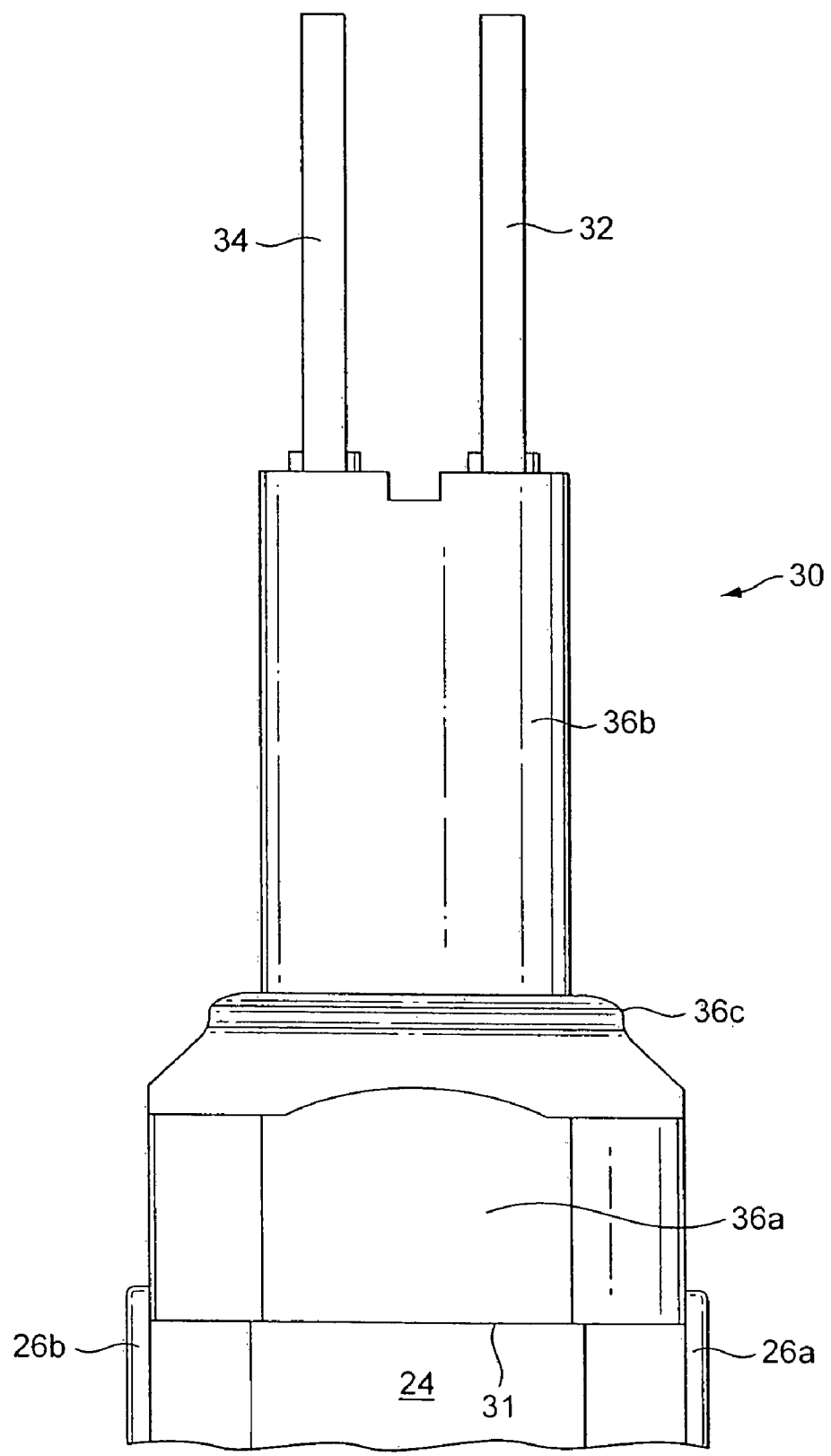
FIG. 5 is a side view of the connector arrangement when mounted on a stack-type piezoelectric actuator.
Figure 6:
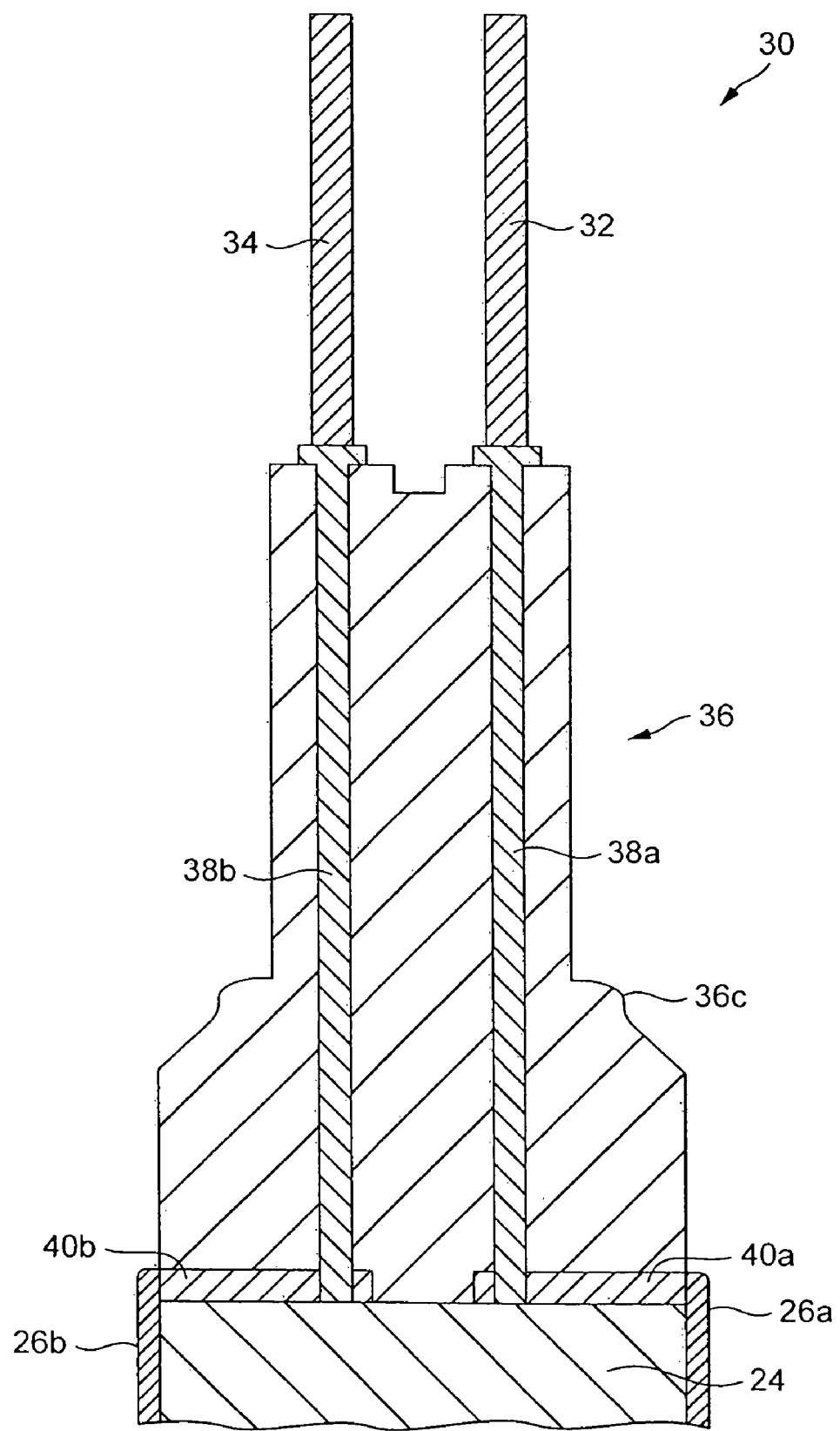
FIG. 6 is a sectional view of the connector arrangement and piezoelectric actuator in FIG. 5.
Figure 7:
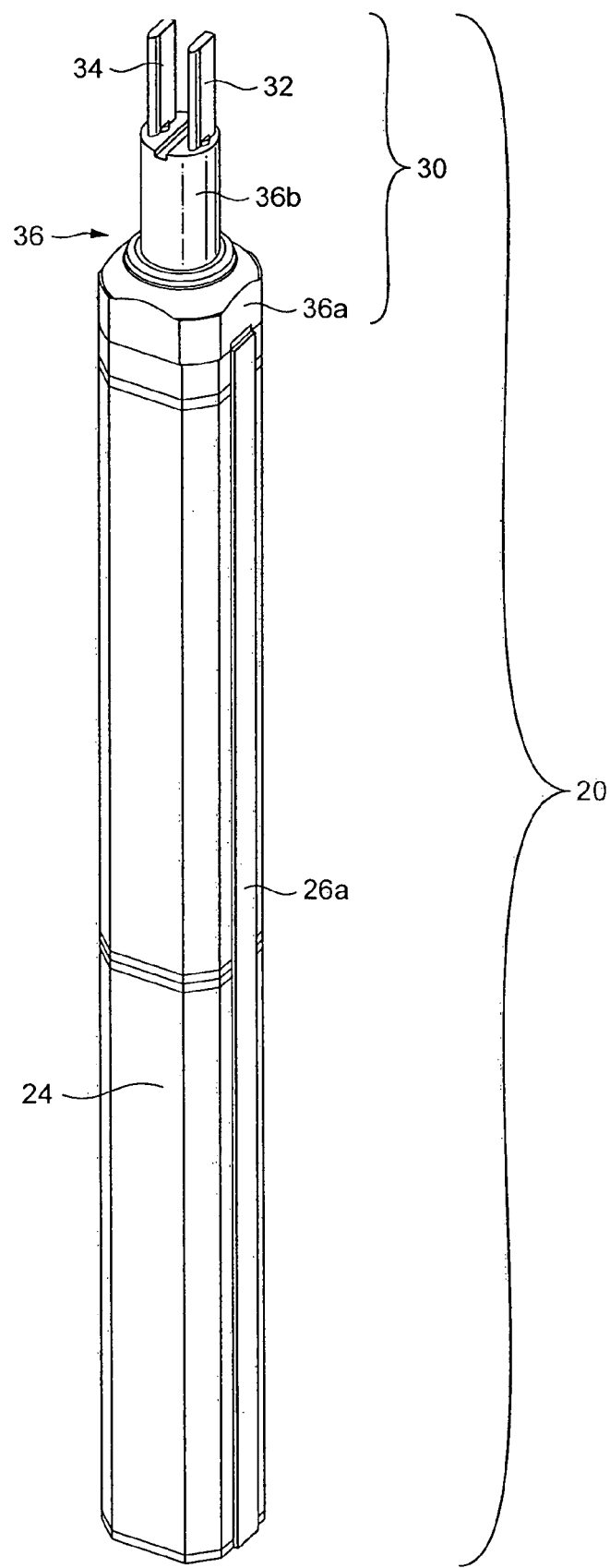
FIG. 7 is a perspective view of the connector arrangement when mounted on a stack-type piezoelectric actuator.

Referring now to FIGS. 5 to 7, when the connector module 30 is mounted on and bonded to the stack 24, the base end face 31 of the base portion 36a is located adjacent to, and abuts against, a substantially flat upper end face of the stack 24. Moreover, the base portion 36a is shaped so that its boundary profile, or "outer envelope", substantially matches that of the upper end face of the stack 24 and, as a result, there is no significant geometric transition between the stack 24 and the connector module 30. Once the stack 24 and the connector module 30 are assembled together, they are received within the accumulator volume 12, which contains high pressure fuel, in use. Therefore, a particular advantage of the invention is that since the cross section of the base portion 36a is configured to be comparable with that of the stack 24, the adverse effects of high hydrostatic forces are avoided. In addition the exposure of relatively low-strength materials (e.g. overmoulded plastics parts) to high pressure fuel is avoided. In previous proposed designs, connector module edges of plastics construction overhang the boundary of the stack 24 such that high pressure fuel exerts a force on the connector module that, over time, may lead to injector failure due to the connector module becoming detached from the stack 24. In the present invention, there is no overhang of the stack 24 by the connector module 30 so the problem is avoided.

As the profile of the base portion 36b is comparable to that of the stack 24, the first and second distribution electrodes 26a, 26b are permitted to extend upward beyond the end face of the stack 24 such that their inner facing surfaces make contact with the radially outer faces of the contact plates 40a, 40b. An advantage of this arrangement, particularly when the connector module 30 is used for a piezoelectric actuator of the type described, is that the contact plates 40a, 40b provide a rigid contact surface for the distribution electrodes 26a, 26b. This is a marked improvement over previously proposed designs in which contact between the connector terminals and the distribution electrodes occurs at a point along the stack side face with connector terminals extending over and around the upper face of the stack and onto the stack sides for connection with the distribution electrodes.

Figure 8:
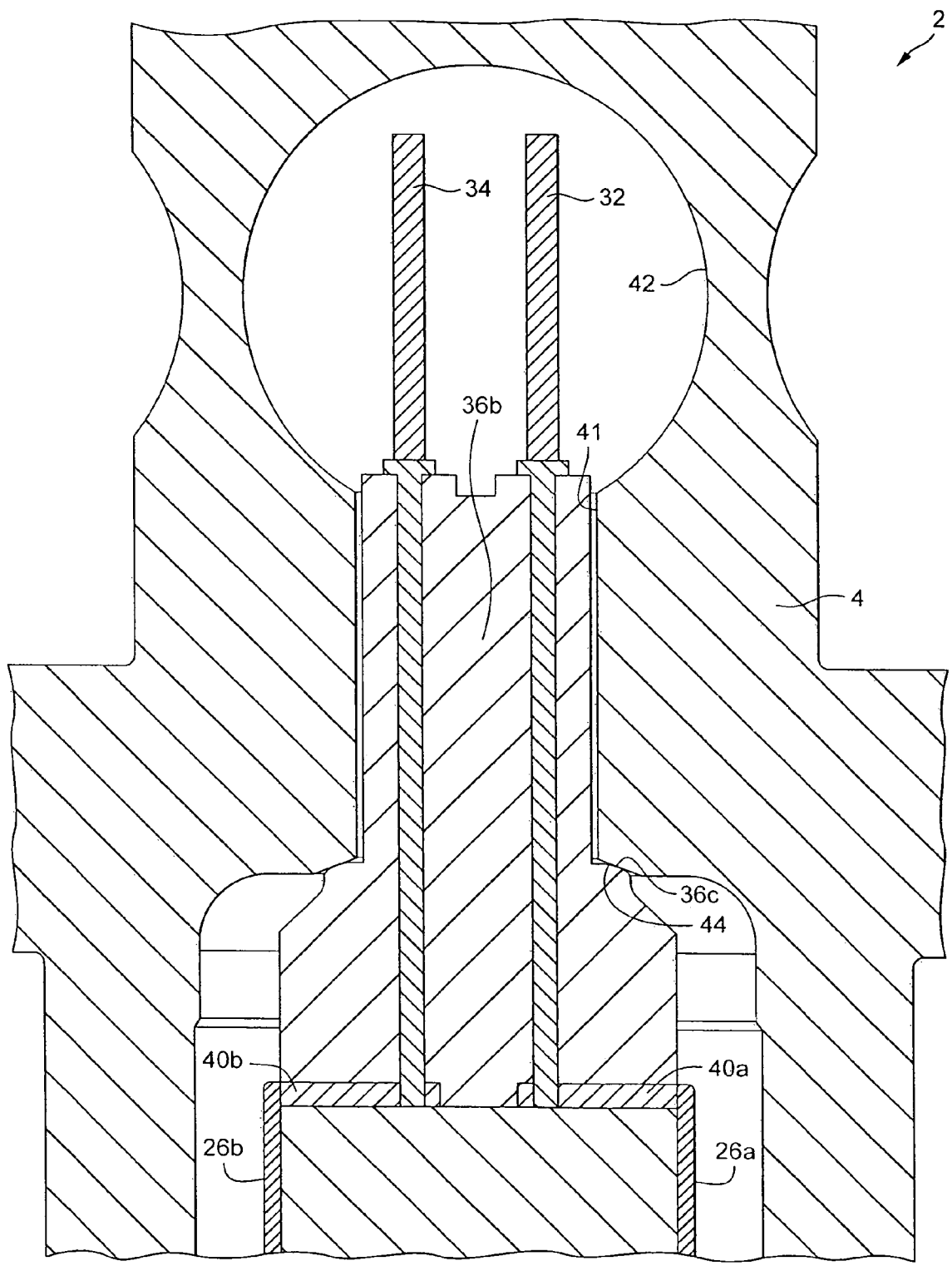
FIG. 8 is an enlarged part-sectional view of the piezoelectric actuator as shown in FIG. 7 when installed within an injector accumulator volume.

FIG. 8 shows in detail the actuator 20 (comprising the stack 24 and the connector module 30) installed within the accumulator volume 12 and the sealing interface that the connector module 30 establishes with the injector body 4. When the actuator 20 is installed within the accumulator volume 12 of the injector 2, the stem portion 36b of the module 30 extends through the longitudinal channel 41, which communicates with the accumulator volume 12, such that the terminal blades 32, 34 protrude into the lateral recess 42 through the open, upper end of the channel 41. The lateral recess 42 constitutes a connector socket for receiving a wiring harness connector (not shown), by which means the actuator 20 is connected to the external power supply. The stem region 36b is received within the channel 41 to such an extent that the annular shoulder region 36c of the module 30 engages an internal mating surface 44 of the accumulator volume 12 in the region of communication between the lower end of the longitudinal channel 41 and the accumulator volume 12. The internal surface 44 is substantially frustoconical in order to provide a uniform surface with which the shoulder region 36c of the connector module 30 engages. This ensures that a substantially fluid tight seal is established, in use, against the egress of high pressure fluid. The sealing function of the connector module 30 is improved rather than impaired by the hydrostatic forces acting on the actuator 20 and, hence, a substantially leak-proof installation is achieved.

Since the actuator 20 is disposed within an accumulator volume filled with high pressure fuel, it is necessary to protect the actuator 20 against deterioration. To this end the actuator is largely enveloped within a polymeric sleeve for the purposes of electrical insulation and chemical protection. Although the encapsulation sleeve is not shown in FIG. 8 for the purpose of clarity, the sleeve extends along the entire length of the stack 24, up onto the base 36a of the connector module 36. It is permissible for the encapsulation sleeve to extend onto the shoulder region 36c provided it does not interfere with the point of sealing contact between the module 30 and the wall of the accumulator volume 12.

Figure 9:
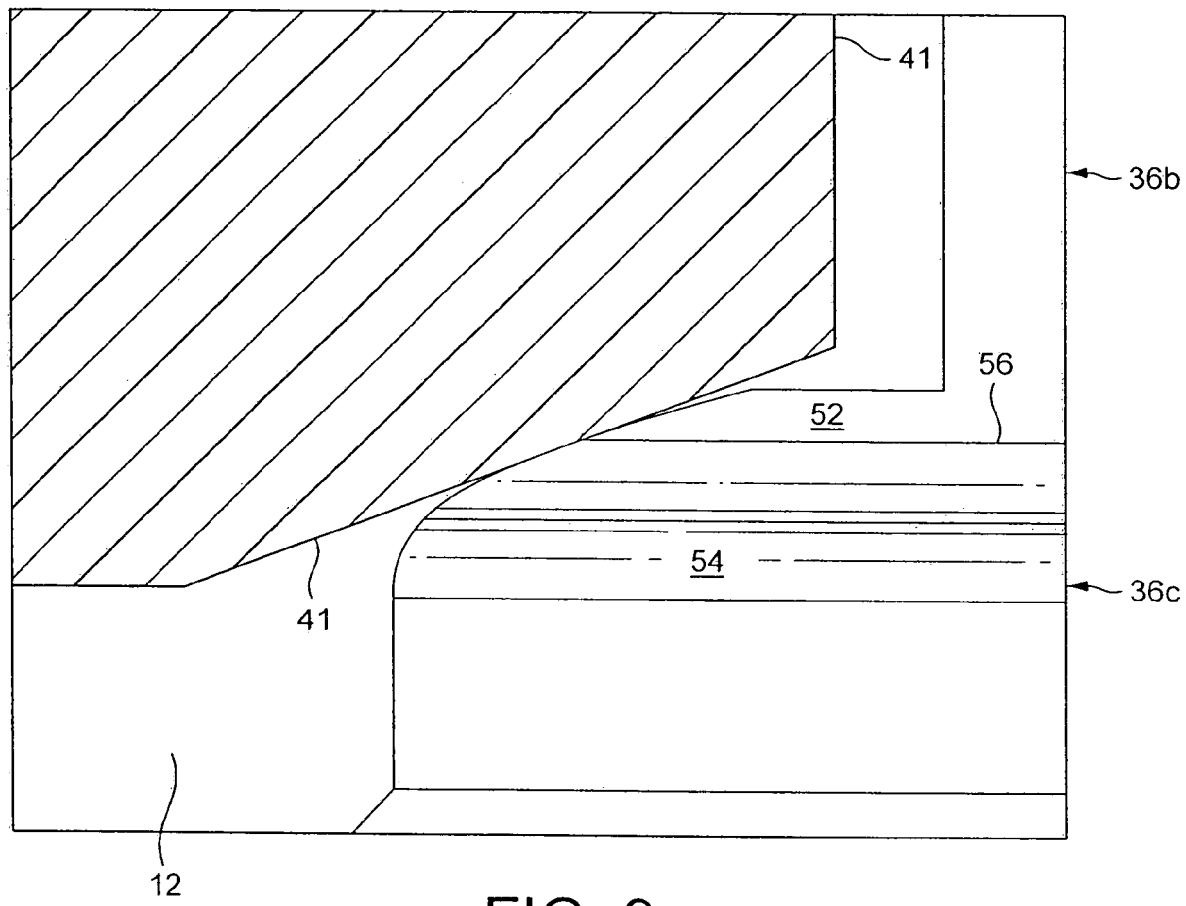
FIG. 9 is a further enlarged part-sectional view of the piezoelectric actuator when installed within an injector accumulator volume, as shown in FIG. 8.

As shown more clearly in FIG. 9, the shoulder region 36c includes a first, upper seating region 52 of frustoconical form and a second, lower seating region 54, at least partly of frustoconical form, but which transitions into a radiused surface. It should be appreciated that the first seating region 52 may also be partly of frustoconical form. The mutual interface of the upper seating region 52 and the lower seating region 54 defines a seating line 56 which engages the internal surface 44 when the actuator 20 is installed within the accumulator volume 12 of the injector 2. The use of a seating line 56 to engage the internal surface increases the efficacy of the seal achieved by the module 30 since the hydrostatic force acting on the actuator 20, in use, is concentrated at a narrow margin instead of spreading the applied force over a relatively large seating region which could adversely affect the sealing properties of the module. Further, the seating line 56 may be arranged to deform, in use, such that the module 30 "beds in" over the seating line 56 so as to take account of eccentricities in either the internal surface 44 or the seating line 56.

Figure 10A:
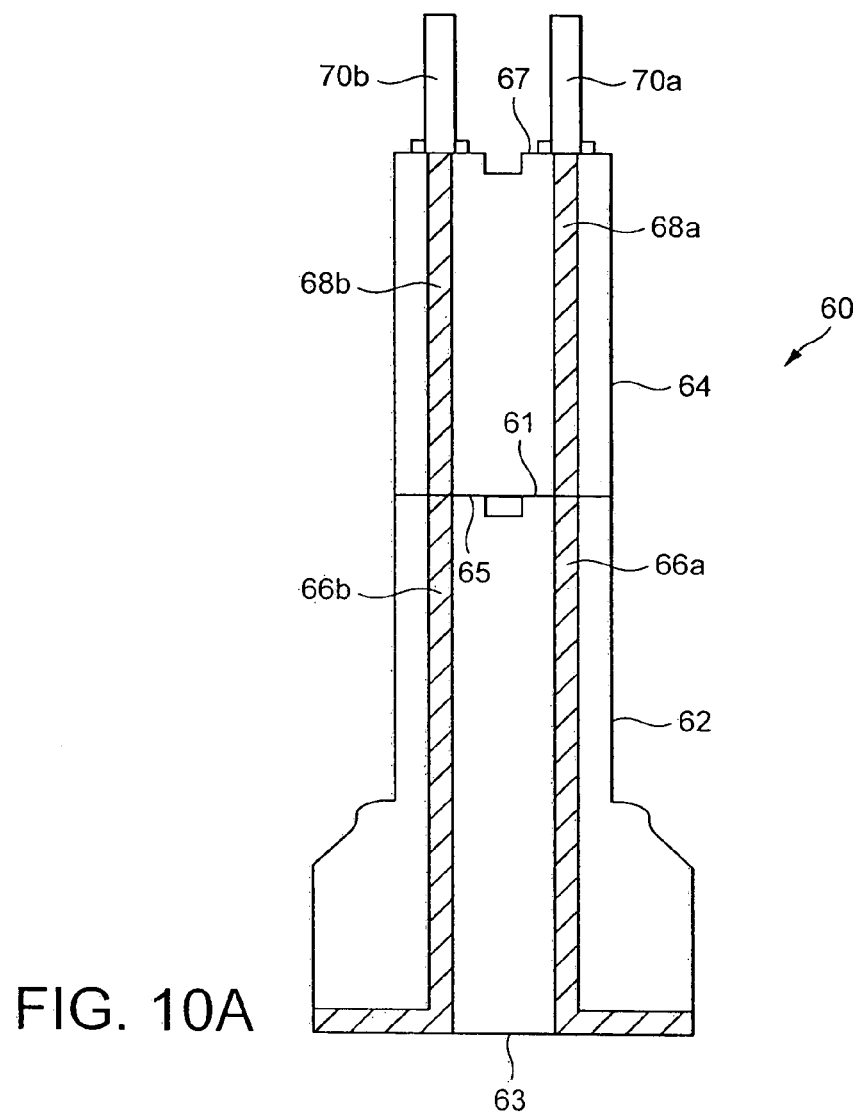
FIGS. 10a and 10b show an alternative embodiment of the invention.
Figure 10B:
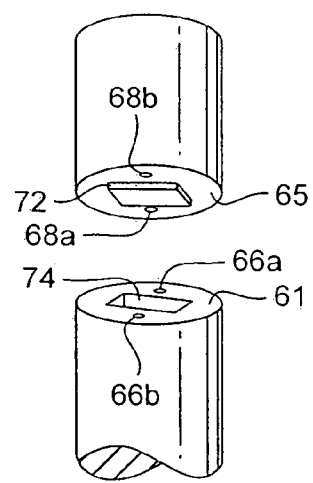

In this embodiment, the connector module 30 is a unitary component and the ceramic body member 36 is shaped as necessary during manufacture to optimise the sealing characteristics of the connector module 30 for a particular application. However, it is possible that, due to a particular installation, the channel 41 within which the stem portion 36b of the connector module 30 is received is too long for the connector module 30 to be manufactured as a single part. This particular scenario is addressed in an alternative embodiment of the invention, as illustrated in FIGS. 10a and 10b, in which a connector module 60 is formed from a body member 62 and an extension piece 64 mounted thereon. It will be appreciated that the configuration of the base member 62 in FIG. 10a and 10b is substantially the same as the body member 36 of the previous embodiment so it will not be described again in detail here.

As in the previously described embodiment, the body member 62 is provided with terminal means including first and second terminal pins 66a, 66b extending longitudinally therethrough. The terminal pins 66a, 66b have opposite ends terminating at respective upper and lower end faces 61, 63 of the body member 62. In a similar manner, terminal pins 68a, 68b extend longitudinally through the extension piece 64 and terminate at its upper and lower end faces 65, 67. The ends of the terminal pins 66a, 66b; 68a, 68b are affixed to the associated end faces 61, 63; 65, 67 of the body member 62, or the extension piece 64 by metallised regions (not shown).

In order to assemble the connector module 60, the lower end face 65 of the extension piece 64 is fixedly mounted on the body member 62, for example by brazing. Electrical connection is therefore established between the terminal pins 66a, 66b of the body member 62 and the terminal pins 68a, 68b of the extension piece 64. Correct alignment of the body member 62 and the extension piece 64 may be ensured by the provision of a projection 72 on the extension piece 64 and a corresponding recess 74 on the face 61 of the body member 62. Other suitable complimentary formations may also be provided for this purpose. To complete the connector module 60, terminal blades 70a, 70b, forming part of the terminal means, are brazed or otherwise attached to the upper end face 67 of the extension piece 64.

As a result of the arrangement described above, the overall length of the connector module may be increased to suit a particular injector installation without compromising the structural rigidity that would likely occur if such an extended connector module 60 was manufactured as a single ceramic-bodied part.

Although the terminal pins 66a, 66b; 68a, 68b are described as relatively short separate sections which are joined, or electrically connected, at the junction between the base member 62 and the extension piece 64, it should be understood that each terminal may alternatively be formed from a single, relatively long member that extends along the entire length of the extended module 60.

Figure 11:
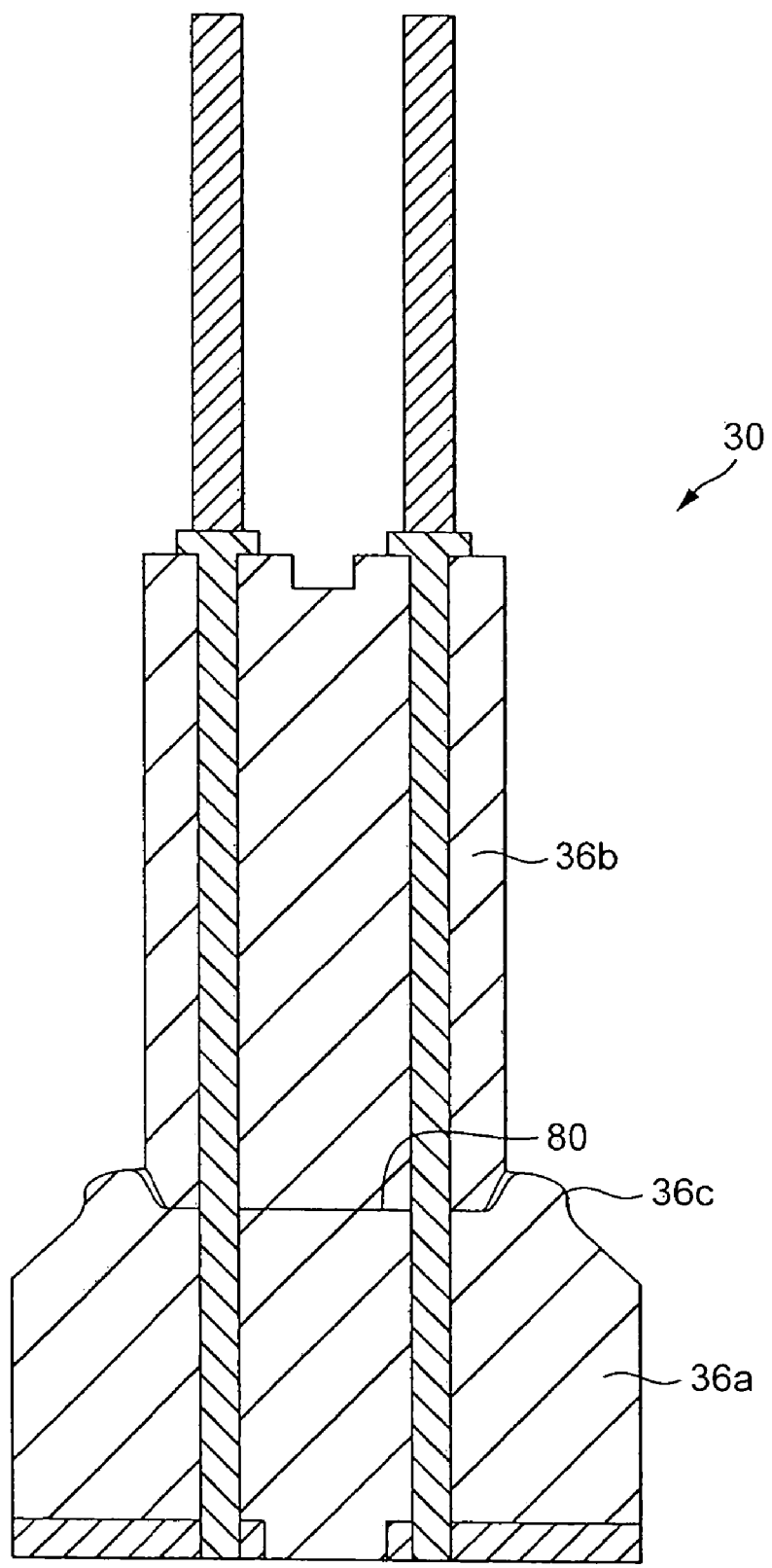
FIG. 11 shows a further embodiment of the invention.

Another alternative embodiment is shown in FIG. 11, where like parts are denoted by like reference numerals. In this embodiment, the base member 36a of the module 30 is a separate part to the stem region 36b. The base member 36a terminates at the shoulder region 36c and a recess 80 in the upper end face of the base region defines a pocket within which the stem region 36b is received and secured thereto by a suitable adhesive. Forming the module 30 in this way avoids stresses that occur at the transition between the base member 36a and the stem region 36b when they are formed as a unitary part.

Since the base member 36a is of ceramic form, it is resistant to the high pressures and temperatures within the fuel accumulator volume 12 as well as being resistant to chemical attack. The stem region 36b may also be formed from ceramic. However, it is possible to form the stem region 36b from an alternative material, for example plastics, if desired. It should also be appreciated that the base member 36a itself may be formed from a material other than ceramic if the environment in which it is located permits. However, a base member 36a of ceramic form is preferred when used within fuel injection equipment.

The terminal pins 38a, 38b described with reference to previous embodiments are not limited to having a "rod-like" or "wire" form and may also be stamped or otherwise formed from metallic sheet material. Although rod-like terminal pins may be more suitable to insert through drilled ceramic components, stamped terminal pins may be more readily shaped for inclusion within a plastics overmoulded stem region.

Having described particular preferred embodiments of the present invention, it is to be appreciated that the embodiments referred to are exemplary only and that variations and modifications may be made without departing from the scope of the invention as set forth in the appended claims.

For example, although in this description, the connector module 30 has been described as including terminal blades 32, 34, terminal pins 38a, 38b, and contact plates 40a, 40b all of positive and negative polarity, the invention is also applicable to a connector module that is arranged such that a single terminal member extends through the body member 36, 62 and terminates at a single contact plate for connection to a suitable component. Conversely, the invention is also applicable to a connector module that is provided with three or more terminal blades, terminal pins and contact plates if a particular application so requires.

The invention claimed is:

1. A piezoelectric actuator for use in a fuel injector, the actuator comprising:

a stack of one or more piezoelectric elements for receipt within an accumulator chamber of the injector, a distribution electrode arrangement for generating an electric field within the stack, and an electrical connector arrangement including a body member formed of ceramic material and defining an external boundary, a base portion that has an upper face defining a pocket, and a separate stem portion received within the pocket and projecting from the base portion, wherein the base portion defines a base end face for abutment with the adjacent end face associated with the stack, said base end face having an outline shaped to match the outline of the adjacent end of the stack, and further defines a shoulder region formed of ceramic material forming a sealing surface having a frustoconical portion and a radiused portion for abutment with an internal frustoconical surface defined by the accumulator chamber to form a fluid tight seal without an elastomeric sealing element, the electrical connector arrangement further comprising a terminal arrangement for connecting to an external power supply so as enable voltage supply to the distribution electrode arrangement, the terminal arrangement including first and second terminal blades arranged side by side and configured to couple with a connector connected to the external power supply, first and second terminal pins attached to the first and second terminal blades respectively at one of respective first terminal pin ends, said terminal pins arranged side by side and disposed internal to the external boundary of the body member, and first and second contact plates attached to the first and second terminal pins at a respective one of second terminal pin ends opposite the first terminal pin ends, wherein each of the first and second contact plates is connected to a respective one of the first or second terminal blades by way of a respective one of the first and second terminal pins so as to form a first and second conductor path from the external power supply to the distribution electrode arrangement, and the base end face is recessed to accommodate the first and second contact plates.

2. The piezoelectric actuator as claimed in claim 1, wherein the distribution electrode arrangement includes first and second distribution electrodes arranged one on either side of the stack and wherein each of the first and second contact plates is connected with a respective one of the first and second distribution electrodes.

3. The piezoelectric actuator as claimed in claim 2, wherein each of the first and second contact plates includes a radially outer face for contacting an inner surface of the respective one of the first and second distribution electrodes.

4. The piezoelectric actuator as claimed in claim 1, wherein the materials of the first and second terminal members and the body member are selected such that their coefficients of expansion are substantially the same.

5. The piezoelectric actuator as claimed in claim 1, wherein the body member is a unitary body of ceramic material.

6. The piezoelectric actuator as claimed in claim 5, wherein the base portion and the stem portion are separate and distinct parts.

7. The piezoelectric actuator as claimed in claim 1, wherein the body member is provided with an extension piece to extend the overall length available to accommodate the first and second terminal members.

* * * * *